US010910256B2

(12) United States Patent
Letertre et al.

(10) Patent No.: US 10,910,256 B2
(45) Date of Patent: Feb. 2, 2021

(54) PSEUDO-SUBSTRATE WITH IMPROVED EFFICIENCY OF USAGE OF SINGLE CRYSTAL MATERIAL

(71) Applicant: Soitec, Crolles (FR)

(72) Inventors: Fabrice Letertre, Grenoble (FR); Oleg Kononchuk, Grenoble (FR)

(73) Assignee: Soitec, Crolles (FR)

( * ) Notice: Subject to any disclaimer, the term of this patent is extended or adjusted under 35 U.S.C. 154(b) by 909 days.

(21) Appl. No.: 14/422,596

(22) PCT Filed: Sep. 6, 2013

(86) PCT No.: PCT/IB2013/001940
§ 371 (c)(1),
(2) Date: Feb. 19, 2015

(87) PCT Pub. No.: WO2014/037793
PCT Pub. Date: Mar. 13, 2014

(65) Prior Publication Data
US 2015/0243549 A1 Aug. 27, 2015

(30) Foreign Application Priority Data
Sep. 4, 2012 (FR) ...................................... 12 58227

(51) Int. Cl.
*H01L 21/762* (2006.01)
*B32B 7/12* (2006.01)
(Continued)

(52) U.S. Cl.
CPC .......... *H01L 21/76251* (2013.01); *B32B 7/12* (2013.01); *B32B 9/04* (2013.01);
(Continued)

(58) Field of Classification Search
CPC .. C30B 29/68; B32B 7/12; B32B 9/04; B32B 38/0004; H01L 21/76251; Y10T 156/1062
See application file for complete search history.

(56) References Cited

U.S. PATENT DOCUMENTS

| 5,650,363 A | 7/1997 | Endroes et al. |
| 6,716,722 B1 * | 4/2004 | Furihata ............. H01L 21/2007 257/E21.122 |

(Continued)

FOREIGN PATENT DOCUMENTS

| CN | 1104039 C | 3/2003 |
| CN | 102624352 A | 8/2012 |

(Continued)

OTHER PUBLICATIONS

Chinese Second Office Action and Search Report for Chinese Application No. 201380045848.X dated Apr. 1, 2017, 16 pages with translation.

(Continued)

*Primary Examiner* — Mark A Osele
*Assistant Examiner* — Christopher C Caillouet
(74) *Attorney, Agent, or Firm* — TraskBritt (57) ABSTRACT

The invention relates to a method for fabricating a pseudo-substrate comprising the steps of providing a single crystal ingot, providing a handle substrate, cutting a thin slice from the single crystal ingot, and attaching the thin slice to the handle substrate to form a pseudo-substrate. According to the invention, the thickness of the thin slice is substantially equal or inferior to a critical thickness below which the slice, if taken alone, is no longer mechanically stable. The invention further relates to a semiconductor structure.

8 Claims, 7 Drawing Sheets

(51) Int. Cl.
  *B32B 9/04* (2006.01)
  *B32B 38/00* (2006.01)
  *C30B 29/68* (2006.01)
  *C30B 33/00* (2006.01)
  *H01L 21/18* (2006.01)
  *H01L 21/02* (2006.01)
  *C30B 33/06* (2006.01)
  *H01L 27/12* (2006.01)
  *H01L 33/00* (2010.01)

(52) U.S. Cl.
  CPC .............. *C30B 29/68* (2013.01); *C30B 33/00* (2013.01); *C30B 33/06* (2013.01); *H01L 21/02002* (2013.01); *H01L 21/185* (2013.01); *H01L 27/1203* (2013.01); *B32B 2457/14* (2013.01); *H01L 33/0093* (2020.05); *Y10T 156/1062* (2015.01); *Y10T 428/24942* (2015.01)

(56) References Cited

U.S. PATENT DOCUMENTS

| | | | | |
|---|---|---|---|---|
| 2003/0036587 | A1* | 2/2003 | Kozak | C08K 5/54 523/445 |
| 2004/0110320 | A1* | 6/2004 | Aspar | H01L 21/6835 438/110 |
| 2004/0187766 | A1 | 9/2004 | Letertre | |
| 2004/0187768 | A1* | 9/2004 | Itani | C30B 11/00 117/81 |
| 2009/0321747 | A1* | 12/2009 | Murphy | H01L 21/76254 257/77 |
| 2012/0074591 | A1 | 3/2012 | Riaf | |
| 2012/0086312 | A1* | 4/2012 | Kobayashi | H03H 3/10 310/348 |
| 2013/0157440 | A1 | 6/2013 | Koudymov et al. | |
| 2013/0207244 | A1* | 8/2013 | David | H01L 21/76254 257/632 |

FOREIGN PATENT DOCUMENTS

| | | | |
|---|---|---|---|
| CN | 103165625 | A | 6/2013 |
| EP | 1291132 | A2 | 3/2003 |
| EP | 1298234 | A2 | 4/2003 |
| EP | 1324385 | A2 | 7/2003 |
| JP | 53126258 | A | 11/1978 |
| JP | 03-142928 | A | 6/1991 |
| JP | 2003068996 | A3 | 3/2003 |
| JP | 2003-095798 | A | 4/2003 |
| JP | 2004235251 | A8 | 8/2004 |
| JP | 2008010766 | A1 | 1/2008 |
| JP | 2009117533 | A2 | 5/2009 |
| JP | 2010045397 | A2 | 2/2010 |
| JP | 2010135605 | A | 6/2010 |
| JP | 2010182936 | A2 | 8/2010 |
| JP | 2010205918 | A9 | 9/2010 |

OTHER PUBLICATIONS

International Written Opinion for International Application No. PCT/IB2013/001940 dated Jan. 17, 2014, 5 pages.
Japanese Notice of Reasons for Rejection for Japanese Application No. 2015-529138 dated Jun. 6, 2017, 7 pages.
International Search Report for International Application No. PCT/IB2013/001940 dated Jan. 17, 2014, 4 pages.
Chinese Second Office Action and Search Report for Chinese Application No. 201380045848.X dated Aug. 22, 2016, 17 pages with translation.
Chinese Third Office Action and Search Report for Chinese Application No. 201380045848.X dated Aug. 2, 2017, 8 pages with translation.
Japanese Search Report for Japanese Application No. 2015-529138 dated May 26, 2017, 60 pages, with translation.
Chinese Search Report for Chinese Application No. 201380045848.X dated Aug. 8, 2016, 2 pages.
Korean Notification of Reason for Refusal for Korean Application No. 1020057006801 dated Aug. 8, 2019, 8 pages.
Chinese Supplementary Search Report for Chinese Application No. 201380045848, dated Mar. 21, 2017, 2 pages.
Japanese Decision to Grant for Japanese Application No. 2015-529138, dated Mar. 6, 2018, 6 pages with English translation.

* cited by examiner

FIG. 7

PSEUDO-SUBSTRATE WITH IMPROVED EFFICIENCY OF USAGE OF SINGLE CRYSTAL MATERIAL

CROSS-REFERENCE TO RELATED APPLICATIONS

This application is a national phase entry under 35 U.S.C. § 371 of International Patent Application PCT/IB2013/001940, filed Sep. 6, 2013, designating the United States of America and published in English as International Patent Publication WO 2014/037793 A1 on Mar. 13, 2014, which claims the benefit under Article 8 of the Patent Cooperation Treaty and under 35 U.S.C. § 119(e) to French Patent Application Serial No. 1258227, filed Sep. 4, 2012, the disclosure of each of which is hereby incorporated herein in its entirety by this reference.

TECHNICAL FIELD

The invention relates to the fabrication of pseudo-substrates comprising a given thickness of a single crystal material commonly available in the form of a wafer and obtained through growth of single crystal ingots and wafering steps.

BACKGROUND

Silicon-on-insulator or SOI materials are known examples of pseudo-substrates, as they comprise a thin layer of superficial single crystal silicon separated from a silicon-based substrate by a layer of silicon oxide. Such composite substrates are considered as pseudo-substrates because the oxide layer introduces an interruption of crystallinity between the front and the back sides of the substrate, which cannot be fabricated by a classical ingot growth technique and subsequent wafering process.

SOI substrates for which the superficial layer should have a thickness of approximately 1 µm or less, are fabricated using the SMART CUT® technology (in-depth weakening by ion implantation, molecular bonding, splitting, and any required finishing steps), whereas SOI substrates requiring a superficial layer of approximately 10 µm or more are obtained using mechanical bonding and thinning technologies. Both technologies require thinning steps and thus imply a level of sacrifice of the initial donor materials. Furthermore, both technologies use single crystal wafers as a starting point.

Such wafers are fabricated by cutting slices of a single crystal ingot, which are subsequently prepared by various wafering steps. These steps are expensive and are not optimized from the point of view of the usage of raw material. For instance, slices of at least 1 mm are required in order to fabricate 500-µm thick wafers, meaning that at least half of the initial raw material is lost in the wafering process.

The substrate thickness is constrained by the limit of mechanical stability, which is the limit below which slices or layers, if taken alone, may break, for example, during subsequent component fabrication or patterning processes. This critical thickness depends on the process, on the force applied to the wafer (the order of magnitude can be of several hundred MPa), and the likelihood that the wafer will break. The mechanical stability can be defined by the ability to survive the process with a likelihood of 1, or, e.g., that only less than about 30 ppm of the slice breaks. In some applications, the substrate is thinned and can even be completely removed at the end of the fabrication processes in order to optimize the final component. For instance, LED applications based on GaN substrates and SiC-based components for power electronics require thinning and/or even removing the substrate for improving the performance of the final device.

An approach known in the art using a wafer cut from a single crystal ingot and then thinning, or even entirely removing the substrate at the end of a component's fabrication process, therefore, leads to important losses or even to a total loss of the wafer, which, for the above-mentioned applications, are manufactured from expensive materials.

EP 1 324 385 A2 describes a modified method to obtain pseudo-substrates by assembling a slice of an SiC or a GaN single crystal material to a handle substrate. A 500-µm thick initial slice is cut from an SiC single crystal ingot then polished before being attached with the polished side to a handle support. The polishing is necessary to enable a molecular bonding between the SiC material and the handle support. Then, the assembly is polished again to improve the crystalline quality in the surface region. The donor pseudo-substrate can then be used for subsequent method steps. In the case of GaN, a 100-µm to 200-µm thick layer of a GaN single crystal ingot is transferred by SMART CUT® technology and attached by molecular bonding on a handle support.

Even though this method already loses less material compared to the known processes that start from wafers, the use of expensive materials is still not optimized, and precious material is lost in surface treatment steps.

Thus, there is thus a need in the semiconductor industry for providing a more efficient way to use expensive single crystal materials when using pseudo-substrates.

BRIEF SUMMARY

The object of the invention is achieved with a method for fabricating a pseudo-substrate comprising the steps of providing a single crystal ingot, providing a handle substrate, cutting a thin slice from the single crystal ingot, and attaching the thin slice to the handle substrate to form a pseudo-substrate. According to the invention, the thickness of the thin slice is substantially equal or inferior to a critical thickness below which the slice, if taken alone, is no longer mechanically stable.

The invention allows fabricating a pseudo-substrate or pseudo-substrate and improves the usage of the single crystal material from the first steps of its fabrication. The main difference and advantage of the invention with commonly used methods is that the invention does not require the use of finished wafers, which are then thinned down using a layer transfer technology, like SMART CUT®, or of polishing steps at the wafer level, as the process according to the invention uses the material directly cut from the ingot at an optimized thickness without going through the additional wafering process steps.

Furthermore, according to the invention, a slice can be cut, in general sawed, from a single crystal ingot with a thickness inferior to that of slices cut in the common approach by a factor of at least two or more. In particular, the invention allows reducing the thickness of the slice to approximately the critical thickness for its mechanical stability and even less. Since the critical thickness depends on the process used to cut the thin slice of the single crystal ingot, on the force applied to the ingot (the order of magnitude can be of several hundred MPa) and the likelihood that the slice will break, the mechanical stability of the thin slice can also be defined by the ability to survive the cutting or sawing process with a likelihood of 1, or, e.g., that only less than about 30 ppm of the slice breaks if the slice is taken alone. The mechanical stability is provided by the handle or support substrate. Any subsequent patterning or fabrication step can, therefore, be directly carried out on or in the thin single crystal slice of the pseudo-substrate rather than on a standard wafer.

The invention also allows manufacturing pseudo-substrates with a desired thickness of a single crystal layer, for example, several tens of µm or more, without losing an important part of the initial single crystal material as is the case in the prior art process, or without needing to appeal to a thickening step if the starting point is a thin transferred layer as for an intermediate substrate in a SMART CUT® approach.

Advantageously, the inventive method can further comprise a step of providing a stiffener on the single crystal ingot prior to cutting the thin slice, such that the stiffener and the thin slice form a mechanically stable self-standing structure. The presence of a stiffener provides for the necessary mechanical stability for cutting slices of the crystal ingot at a thickness even below the critical thickness.

Preferably, the stiffener can be a substrate, in particular, a polymer, or a refractory metal. Thus, a temporary substrate can be used so as to form a stiffening layer attached to an end of the single crystal ingot before the cutting step, such that it is possible to cut a thin slice with a thickness inferior to the critical thickness. The attached substrate thus provides the thin slice with enough mechanical stability such that the thin slice and the temporary substrate form a self-standing structure before the attachment step.

Preferably, the step of attaching the thin slice can be carried out with an adhesive, in particular, a ceramic-based composite adhesive or a graphite-based adhesive. Since the thin slice is not directly bonded (no molecular bonding) to the handle substrate, no polishing step of the surface of the thin slice at which the attachment will take place is necessary prior to the attachment step, as the adhesive layer can compensate the surface topology of the thin slice, and the thickness of the thin slice can be substantially equal or inferior to the critical thickness.

Advantageously, when using a stiffener, the inventive method can further comprise a step of removing the stiffener after forming the pseudo-substrate. It is then possible to grow further structures on the single crystal slice of the pseudo-substrate.

Preferably, the stiffener can be a deposited layer, in particular, an oxide layer. Similar to the use of a polymer or other substrates, a deposited layer, such as an oxide layer, allows cutting thin slices with a thickness inferior even to the critical thickness. The thin slice and the deposited layer can thus form a self-standing structure before the attachment step to the handle substrate.

Advantageously, in the case of depositing a stiffening layer such as an oxide layer, the attachment of the thin slice to the handle substrate can be achieved by molecular bonding. With the invention, it is thus even possible to achieve a molecular bonding of a thin slice to the handle substrate without polishing any surface of the single crystal slice, for instance, by using the deposited layer as a bonding layer. Indeed, the deposited layer can be used to compensate the surface topology of the single crystal ingot and thus of the single crystal slice before the attachment to the handle substrate.

The attachment step can advantageously comprise one or more annealing steps.

Advantageously, the inventive method can be carried out without any polishing step of the surface of the thin slice at which the attachment takes place prior to the attachment step. Thus, the slice can be attached to the handle or support substrate without being thinned and preventing further losses in raw material compared to the wafer approach in the fabrication processes known in the art.

Advantageously, the inventive method can further comprise the step of polishing or double-side polishing the pseudo-substrate. The inventive method can also further comprise at least one etching step of a surface of the pseudo-substrate. Thus, it is also possible to remove material after the attachment step in order to reduce the damages inside the structure.

The pseudo-substrate can thus advantageously be prepared for further process steps. For example, the front side having a free single crystal surface and/or the back side of the pseudo-substrate can be polished for allowing subsequent patterning or growing, in particular, epitaxial growing, any semiconductor structure or device on an improved surface. Since the starting thickness of the slice is already smaller than that used in a wafering approach known in the art, any further polishing step can be optimized and will result in reduced loss of the initial single crystal material compared to the approaches known in the art.

Preferably, the method can further comprise the step of chamfering the edges of the pseudo-substrate and/or cutting a flat or a notch in the pseudo-substrate.

Since the pseudo-substrate can advantageously be used in a way similar to a wafer as known in the art, it can, optionally, also be chamfered, and a flat or a notch can be formed on the free single crystal surface of the pseudo-substrate, for instance, in order to signal a crystal plane orientation. However, these steps only take place once the thin slice has been attached to the handle substrate.

Advantageously, the thickness of the thin slice can be substantially equal or inferior to 300 µm for a diameter of 2 inches. With respect to approaches known in the art, the invention has the advantage that the starting thickness of single crystal material, that is, the thickness of the initial slice sawn from the ingot, is already close or substantially equal to the limit of mechanical stability. In particular, in combination with a stiffener, it is even possible to cut a thin slice having a thickness of about 100 µm or less. Therefore, the invention improves the usage of single crystal initial material with respect to the prior art, which requires typically more than twice the thickness of initial material before carrying out any wafering steps.

Preferably, the single crystal can be or can comprise one of a silicon-based material, a germanium-based material, a II-VI or III-V semiconductor material, or a wide band gap material, or sapphire, or ZnO, or a piezoelectric material, or $LiNbO_3$, or $LiTaO_3$. III-V semiconductors can be, for example, InP or GaAs or the like, and wide-band gap materials can be SiC, GaN, AlN or the like, but are not restricted to these examples. Advantageously, the handle or support substrate material can be chosen with a matching coefficient of thermal expansion (CTE).

Advantageously, the inventive method can further comprise the step of fabricating a semiconductor device in or on the pseudo-substrate. Typical fabrication steps comprise polishing, cleaning, layer growth such as epitaxial growth, layer deposition, thermal treatments, and the like. Typical devices are any kind of electronic, optoelectronic, hyper frequency, micro-electro-mechanical system (MEMS), micro-opto-electro-mechanical system (MOEMS) components and the like.

Preferably, the inventive method can further comprise the step of removing the handle substrate after having fabricated the semiconductor device. After total or partial fabrication of components, structures or devices on the free single crystal surface of the pseudo-substrate, the pseudo-substrate can be attached on a final support having the thermal, electrical and/or optical properties adapted to the final application, thereby forming a new assembly. The handle substrate of the pseudo-substrate can then be removed by chemical etching, mechanical polishing, laser radiation or any other technique commonly used for removing layers in this context. In a variant, the entire handle substrate could be removed, thereby exposing the back side of the single crystal slice. At this point, any other technological step can be carried out on the back side, such as further thinning, polishing, patterning, epitaxial growth, and the like. The final structure can, thus, still have a thickness of single crystal slice very close or substantially equal to that of the initial slice cut from the ingot, decreased by any removal necessary for fabricating the final assembly, which corresponds to less losses and improved efficiency of usage of the initial single crystal material with respect to prior art wafering methods.

The object of the invention is also achieved with the semiconductor structure comprising a layer of a single crystal material attached to a substrate, wherein the layer of single crystal material is attached to the substrate by a ceramic-based or a graphite-based adhesive and without any polishing step of the surface of the layer at which the attachment occurs. Furthermore, the thickness of the layer of single crystal material is substantially equal or inferior to a critical thickness below which the layer, if taken alone, is no longer mechanically stable.

The inventive semiconductor structure or pseudo-substrate can, thus, be advantageously used in a similar way to a wafer. The inventive structure can, thus, also be used as a donor wafer in a layer transfer technique such as SMART CUT®, or the like. However, it is to be understood that no such layer transfer technique is required to fabricate the inventive structure itself since patterning and other processes can be carried out directly on the free single crystal surface opposite the surface attached to the substrate.

BRIEF DESCRIPTION OF THE DRAWINGS

The invention will be described in more detail hereafter using exemplary embodiments described in relation with the following figures, wherein.

DETAILED DESCRIPTION

Figure 1:
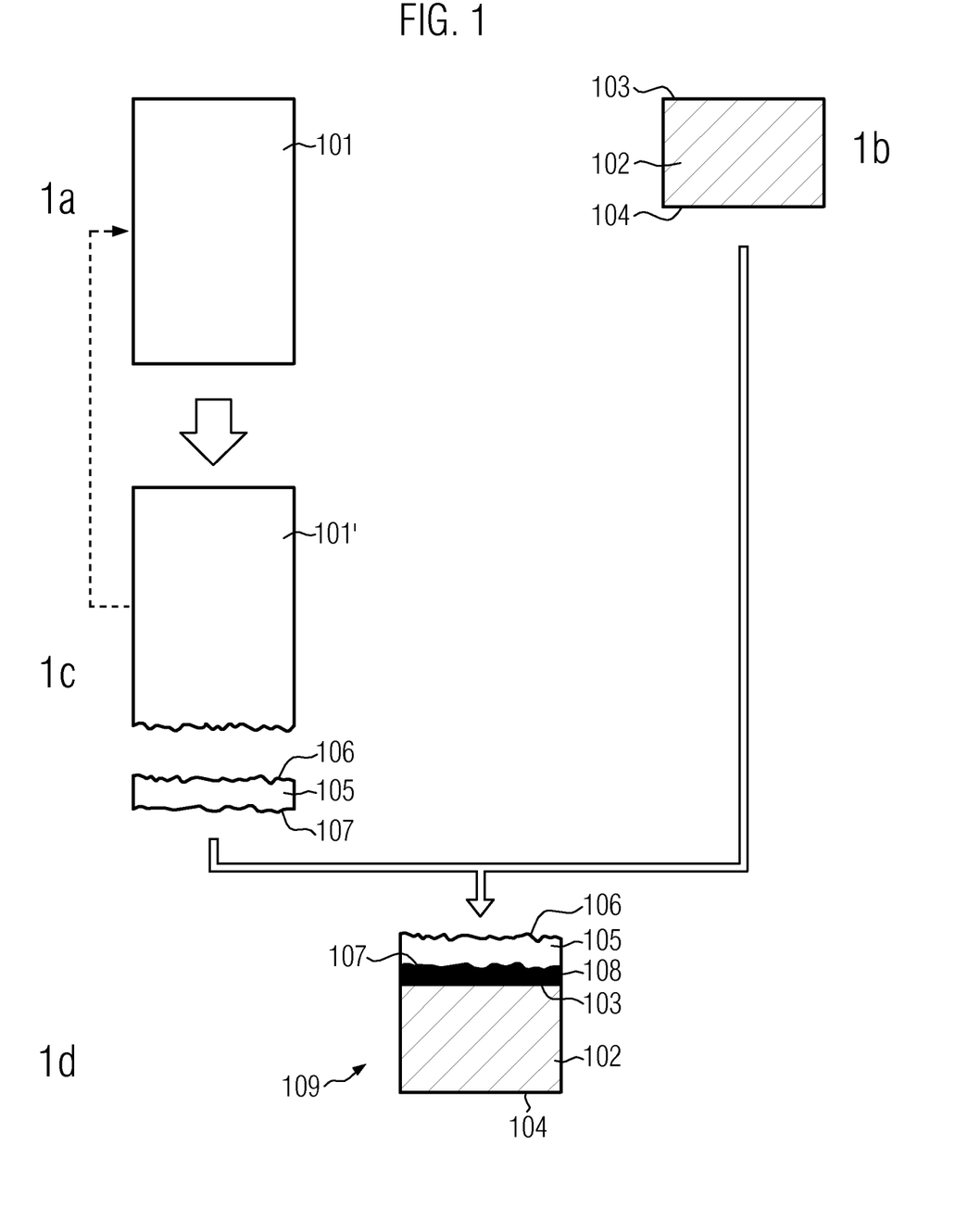
FIG. 1, including portions 1a through 1d, illustrates a first exemplary embodiment of the invention wherein a thin cut slice of an ingot is attached to a handle substrate.

FIG. 1, including portions 1a through 1d, illustrates a first example of an embodiment of the invention.

As shown in portions 1a and 1b of FIG. 1, a single crystal ingot 101 of GaN and a handle substrate 102, in this example, a Si wafer, are provided. The handle substrate 102 comprises two surfaces 103, 104. Crystal ingots of other materials, like SiC, YAG, ZnO, sapphire, Si, Ge, III-V semiconductors, II-VI semiconductors, piezoelectric materials, $LiNbO_3$, $LiTaO_3$, or the like, or other handle substrates 102 of the same or similar materials, provided that the difference in coefficient of thermal expansion (CTE) is low, could also be used.

Next, as illustrated in FIG. 1, portion 1c, a slice 105 of GaN is cut, in particular, sawn, from the single crystal ingot 101. According to the invention, the slice 105 is cut at a thickness substantially equal to a critical thickness below which the slice 105, if taken alone, is no longer mechanically stable. In the first embodiment, the slice 105 has a thickness of approximately 300 µm for a diameter of approximately 2 inches. The remainder 101' of the initial GaN ingot 101 can be reused to obtain further slices for additional semiconductor assemblies. The single crystal slice 105 of GaN comprises two free surfaces 106, 107, both having a level of surface roughness, e.g., due to the sawing process. In the case of reusing the remainder 101' of the initial ingot 101, according to the invention, it is not necessary to polish the surface of the ingot 101' from which the slice 105 was cut.

According to the invention, and as illustrated in FIG. 1, portion 1d, the slice 105 is then attached by one of its free surfaces 107 to one of the free surfaces 103 of the handle substrate 102, thereby forming a pseudo-substrate 109.

In this embodiment of the invention, the attachment is performed using a layer of an adhesive 108, in particular, a ceramic-based adhesive. The adhesive 108 and the handle substrate 102 are preferably both chosen with matching coefficients of thermal expansion with respect to the single crystal slice 105. The use of the adhesive 108 has the particular advantage that the cut single crystal slice 105 can be attached to the handle substrate 102 without having to go through any polishing step of its surfaces 106, 107, as the adhesive layer 108 compensates for the surface roughness of the slice 105.

According to further variants of the invention, the pseudo-substrate 109 can be chamfered and/or a flat and/or a notch can be provided.

Figure 2:
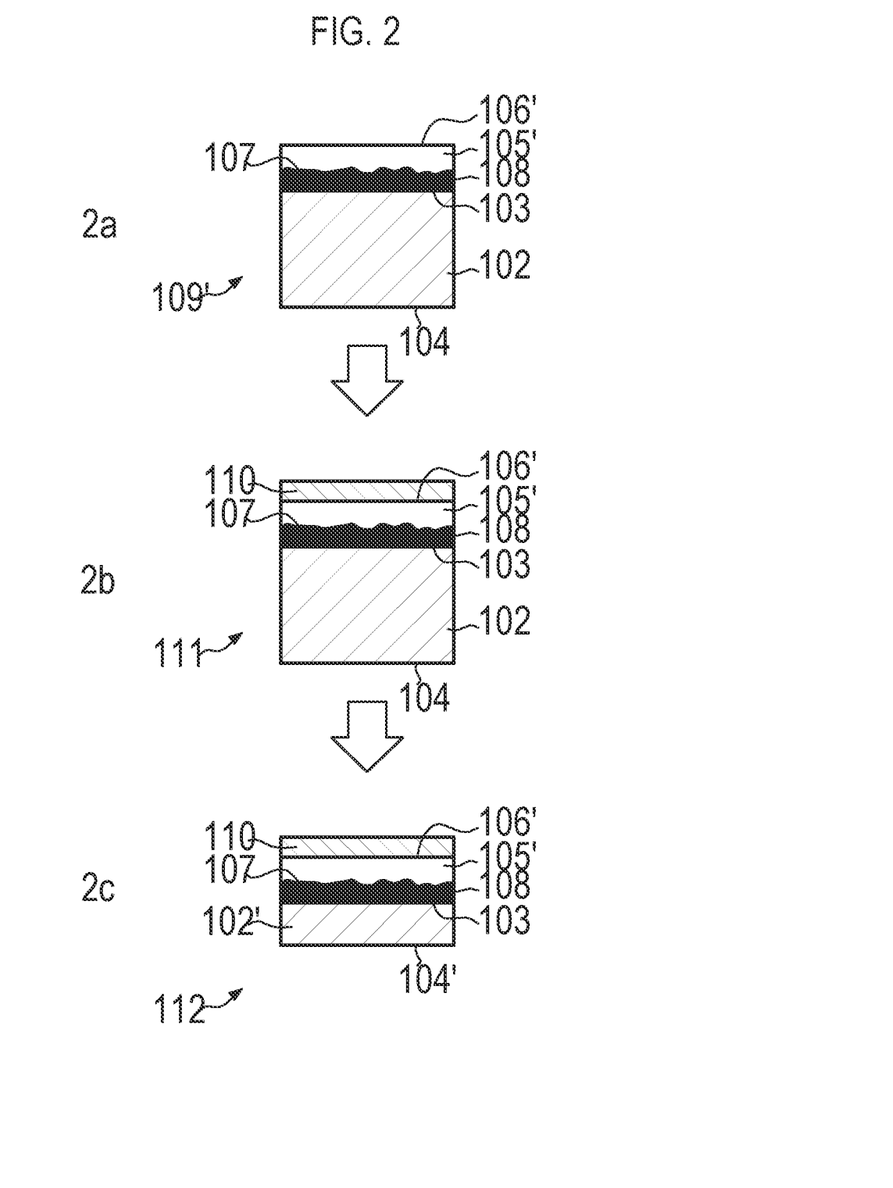
FIG. 2, including portions 2a through 2c, illustrates a second embodiment of the invention in which the thin cut slice is further thinned down.

Portions 2a to 2c of FIG. 2 illustrate the use of the inventive pseudo-substrate 109 according to a second embodiment. As illustrated in portion 2a of FIG. 2, the thin slice 105 can be thinned starting from the free surface 106, thus, the one opposite to where the attachment to the substrate 102 occurred. Thus, the free surface 106 displaying surface roughness can be thinned, in particular, polished, to form a thinned surface 106'. The slice 105 can be thinned to a thickness of approximately 100 µm or less, for instance, even approximately 50 µm, thereby forming a thinned layer 105' and, thus, the thinned pseudo-substrate 109'.

Next, as illustrated in portion 2b of FIG. 2, an epitaxial growth can be initiated on the free thinned surface 106' of the thinned layer 105' to obtain a high-quality GaN single crystal layer 110 and a pseudo-substrate 111 according to the second embodiment.

In a variant of the second embodiment, as illustrated in portion 2c of FIG. 2, the back side surface 104 of the handle substrate 102, thus, the side opposite to where the attachment occurred, can also be thinned to obtain a thinned substrate surface 104' and, thus, a thinned handle substrate 102' in order to correct any flatness defect, or in order to adjust the total thickness of the even more thinned pseudo-substrate 112 according to this variant of the second embodiment. Typically, the material removal is of the order of 50 µm to 500 µm.

Figure 3:
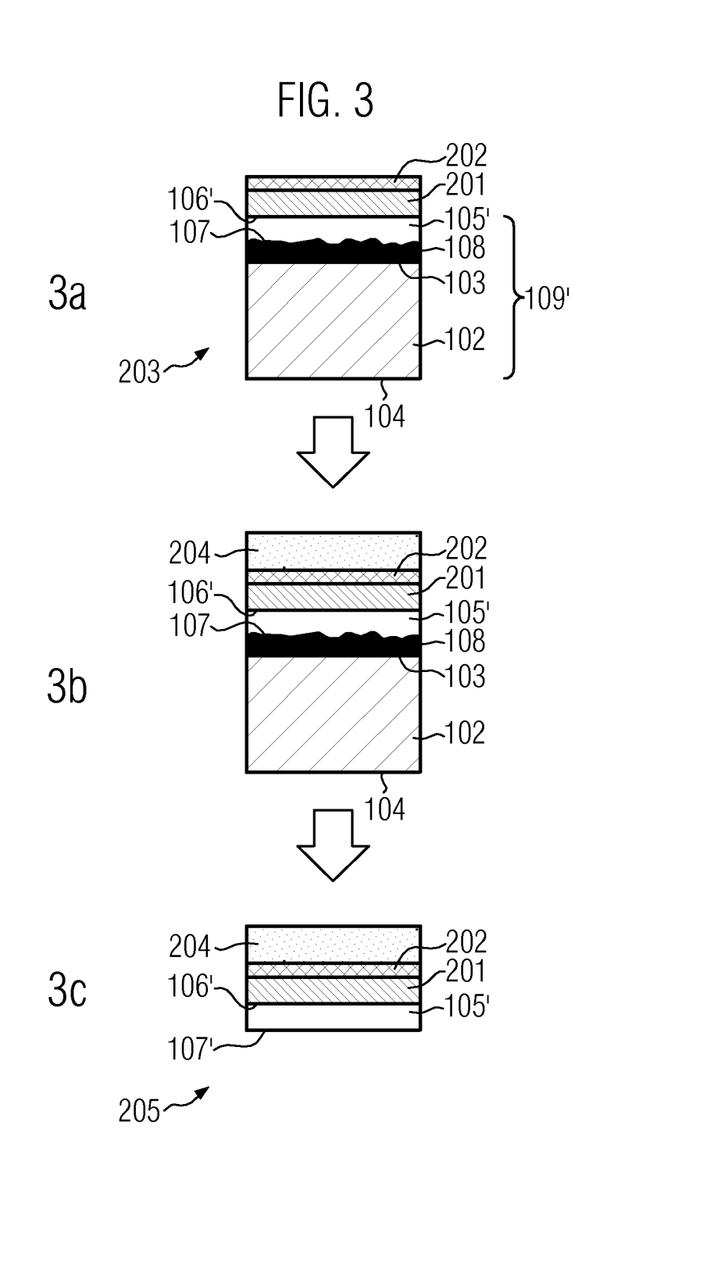
FIG. 3, including portions 3a through 3c, illustrates a third embodiment, describing the fabrication of an electronic device.

The semiconductor assemblies 109, 109', 111 or 112 can then serve as the basis for the fabrication of semiconductor devices as illustrated in FIG. 3, portions 3a to 3c. For example, in the third embodiment, the thinned pseudo-substrate 109' (or 109, or 111 or 112) is used, in particular, for fabricating an LED structure, e.g., based on a GaN/InGaN junction. For instance, the pseudo-substrate 109' (or 109 or 111 or 112) is loaded in a metal organic chemical vapor deposition (MOCVD) epitaxy reactor with a 600° C. to 1100° C. temperature range in order to obtain the InGaN layer 201 of the LED structure.

In portion 3a of FIG. 3, the LED structure may comprise additional layers. In addition, the relative thickness of the layers of the LED structure may vary, compared to the illustration of portion 3a. Further method steps may lead to the deposition of contact layers 202, which are also only representative on the pseudo-substrate 203 illustrated in portion 3a of FIG. 3. Further layers may be deposited. In addition, patterning steps may be provided to interconnect and/or isolate the various layers to form the desired devices.

As illustrated in FIG. 3, portion 3b, a final substrate 204, which can be partially or fully processed and which can be made of or comprise, for example, one of silicon, germanium, a metal such as copper, molybdenum, tungsten, or the like, or a metallic alloy such as WCu, or the like, can be attached to the uppermost layer of the pseudo-substrate 203. These materials are not restrictive and are only exemplary. In particular, any other material suited for LED applications or any power device built using a vertical structure can be used.

As illustrated in FIG. 3, portion 3c, the handle substrate 102 and the adhesive layer 108 are then removed entirely, e.g., by mechanical polishing, such that a final structure 205 is obtained, wherein the original back side surface 107 of the GaN slice 105 has become a free surface 107'. This free surface 107' can, in turn, also be polished, thinned and/or patterned for fabricating an even more complex final device.

Instead of fabricating an LED device, the inventive semiconductor assemblies may be used for any other power device with a vertical structure.

Figure 4:
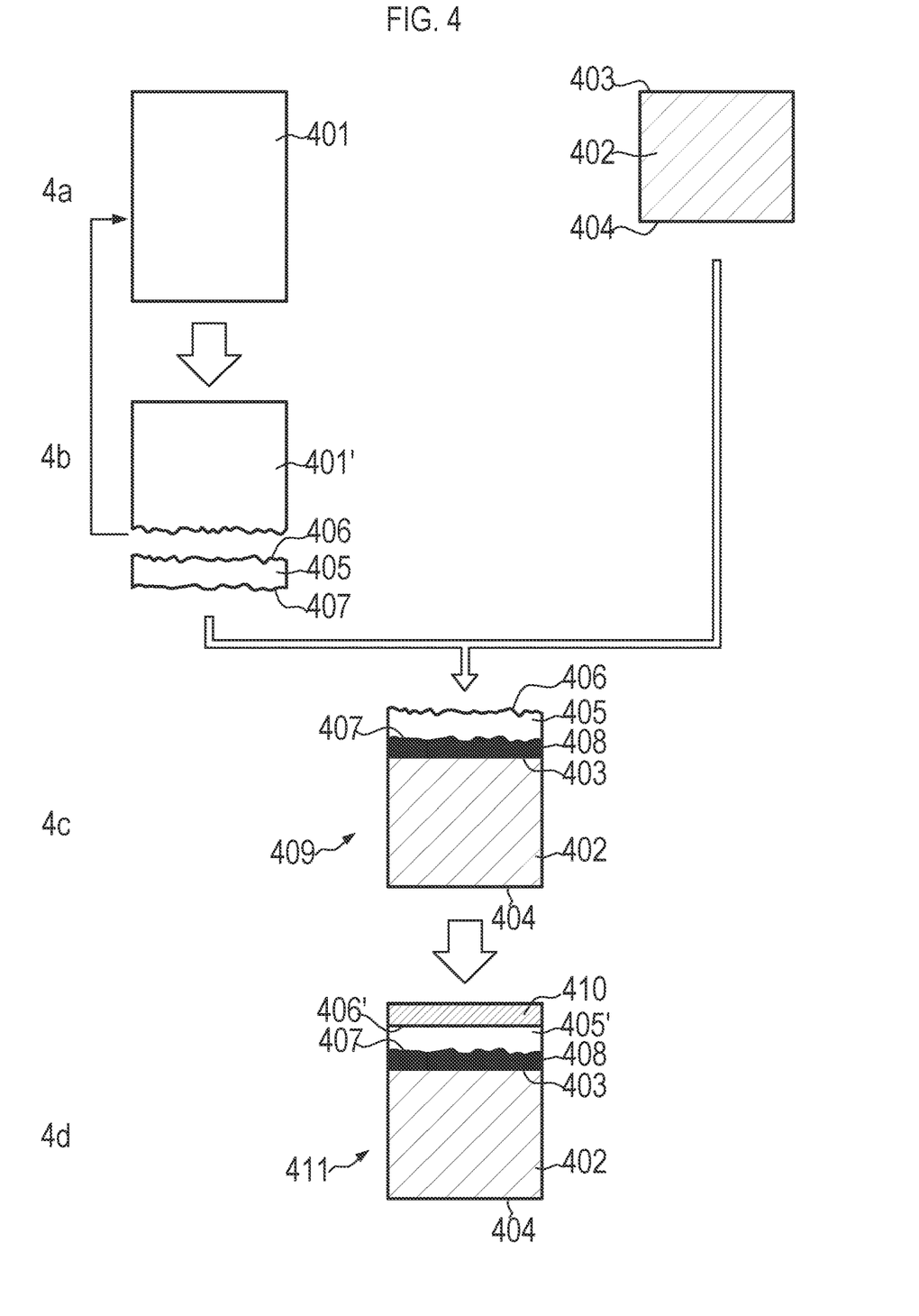
FIG. 4, including portions 4a through 4d, illustrates a fourth embodiment of the invention.

FIG. 4, portions 4a through 4d, illustrates a fourth exemplary embodiment.

FIG. 4, portion 4a, illustrates a single crystal ingot 401 of SiC and a handle substrate 402 of Si. Alternatively, materials such as, for instance, SiC, W, AlN, graphite, or the like, can also be used for the handle substrate 402. Similarly to the first embodiments, as illustrated in portion 4b of FIG. 4, a slice 405 of SiC is cut or sawn from the ingot 401 with a thickness substantially equal to a critical thickness below which the slice 405 is no longer mechanically stable. Here, the slice 405 has two free surfaces 406, 407, both displaying a level or surface roughness due to the cutting process, and has a thickness of approximately 300 µm for a diameter of approximately 2 inches. Like in the first embodiments, the handle substrate 402 also comprises two free surfaces 403, 404, and the remainder 401' of the initial SiC ingot 201 can then be reused, in particular, without undergoing any polishing step, for cutting other single crystal slices.

According to a variant of the invention, and as illustrated in portion 4c of FIG. 4, the slice 405 is then attached via a thermo-mechanically stable adhesive layer 408, for instance, a graphite-based adhesive, to one of the free surfaces 403 of the substrate 402 without going through any polishing step. In particular, the back side of the slice 405, which is the free surface 407 at which the attachment will occur, is not polished before the attachment. The thereby formed pseudo-substrate 409 is then annealed at a temperature in the range of 1000° C. to 1500° C. in order to strengthen the adhesive layer 408.

According to further variants of the inventive method, the pseudo-substrate 409 is then treated similarly to a wafer and undergoes several preparation and finishing steps, such as chamfering, cutting a flat or a notch, and/or polishing the free single crystal surface 406, in order to improve the quality of the surface 406 for a subsequent epitaxial growth.

The pseudo-substrate 409 can also be polished on one of its free surfaces 406, 404, or double-side polished, for example, in order to adjust the thickness of the single crystal slice 405, or the total thickness of the pseudo-substrate 409. Similarly to the first embodiment, the slice 405 of SiC of the second embodiment can be thinned to a thickness in the range of approximately 50 µm to 100 µm to form a thinned slice 405' within thinned surface 406'.

The thinning step can be followed by a step of chemical vapor deposition (CVD) in order to obtain the active part of an electronic component. This is schematically illustrated by a layer 410 in portion 4d of FIG. 4, which is only representative of the resulting structure of final assembly 411, but not of the relative thickness or of the number of layers that can be deposited during this step. In the fourth embodiment, an epitaxial structure with controlled doping, such as a drift layer, of at least approximately 10 µm is deposited in this step, at a temperature higher than 1500° C. The thickness of such a drift layer 410 can define the breakdown voltage of the junction, e.g., in the case of SiC, 100 V for a thickness of 1 µm at $10^6$ dopants per $cm^3$.

According to further variants of the fourth embodiment of the invention, and similarly to the previous three embodiments as illustrated in FIGS. 1 to 3, in the fourth embodiment, other subsequent technological steps can be performed, such as ion implantations, annealing steps, or depositing contact layers. Furthermore, the handle substrate 402 can also be removed using grinding or polishing techniques of the back side or remaining free surface 404 of the substrate 402 on the final assembly 411. Such a step advantageously allows removing the adhesive layer 408 from the back side of free surface 407 of the single crystal slice 405 or thinned slice 405', which can subsequently be treated, for example, in order to build an electrical contact and finally split in order to form final electrical components.

Figure 5:
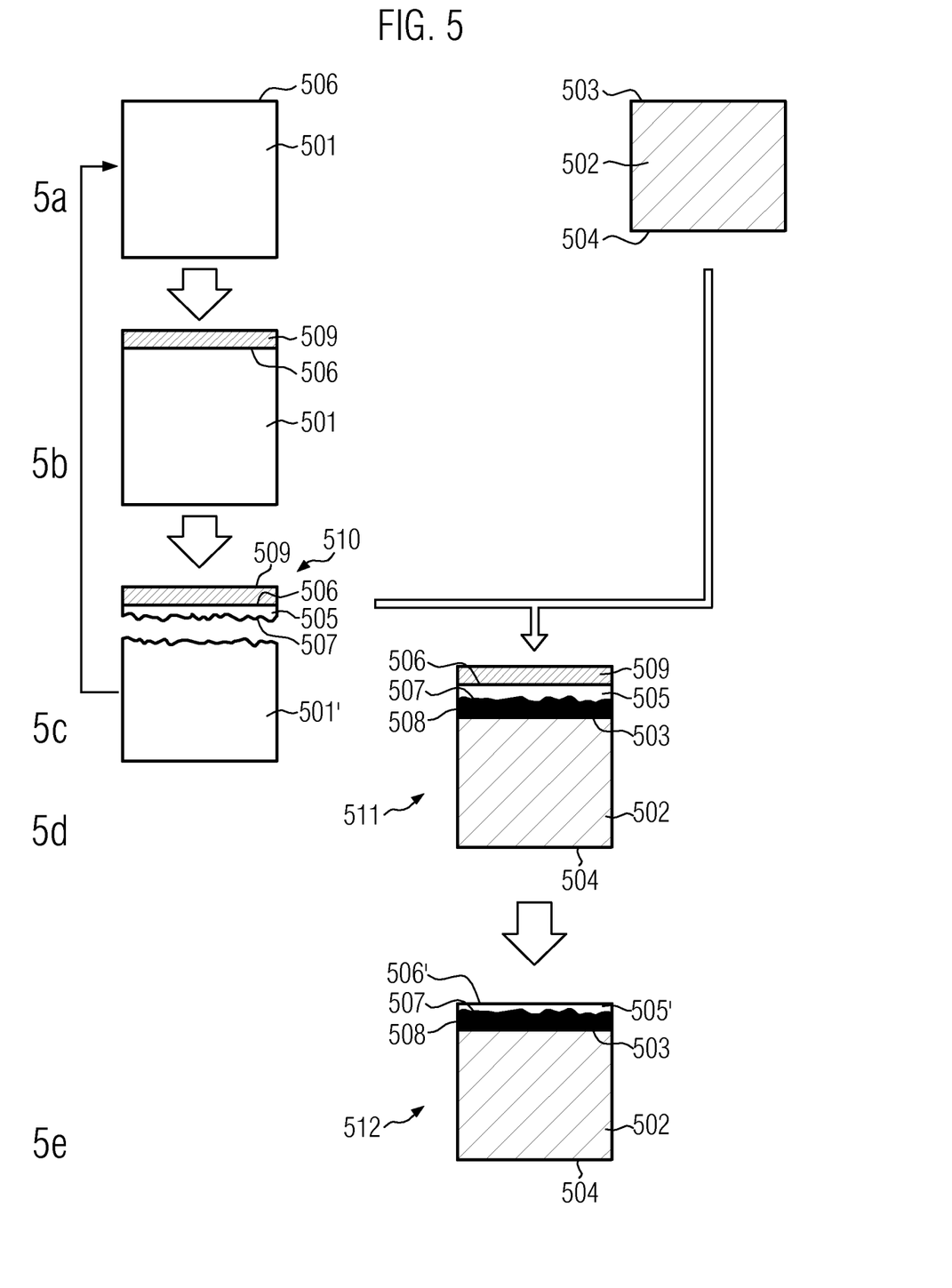
FIG. 5, including portions 5a through 5e, illustrates a fifth embodiment of the invention in which a thin slice is cut below the critical thickness.

FIG. 5, portions 5a through 5e, illustrates a fifth exemplary embodiment.

Portion 5a of FIG. 5 illustrates a single crystal ingot 501 of GaN and a handle substrate 502, in this example, an Si wafer. Alternatively, materials such as, for instance, SiC, YAG, ZnO, AlN, sapphire, Si, Ge, III-V semiconductors, piezoelectric materials, $LiNbO_3$, $LiTaO_3$, or the like, can also be used for the single crystal ingot 501. Materials other than Si can also be used for the handle substrate 502, provided that the difference in CTE is low. Like in the previous embodiments, the handle substrate 502 comprises two free surfaces 503, 504.

In the fifth embodiment, as illustrated in portion 5b of FIG. 5, a layer of a stiffener 509 is attached to a free surface 506 of the single crystal ingot 501. In the fifth embodiment, the stiffener 509 is a substrate, such as a polymer, e.g., a strong polyester adhesive tape such as commercial Mylar tape or the like, but could also be a refractory metal such as W, Mo, or the like, chemically and physically stable, at least under 900° C. In the variant of a layer of stiffener 509 of a refractory metal, the layer of stiffener 509 can have a thickness about 100 µm and can be deposited, e.g., by chemical vapor deposition (CVD).

According to a variant of the invention, the stiffening layer 509 now provides enough mechanical stability to cut a thin slice 505 of the single crystal ingot 501, whose thickness can be even below the critical thickness, as illustrated in portion 5c of FIG. 5. In this example, a slice 505 of about 100 µm is sawn from the ingot 501, which is less than the critical thickness of GaN. The thin slice 505 and the stiffener 509 now form a mechanically stable self-standing structure 510 with a free surface 507 of single crystal material, which can display a level or surface roughness due to the cutting, e.g., sawing, process. Like in the first embodiments, the remainder 501' of the initial single crystal ingot 501 can then be reused, in particular, without undergoing any polishing step, for cutting other single crystal slices 505. This is possible for subsequent cutting steps, as the stiffener 509 will compensate the surface roughness of the ingot remainder 501' and allow sufficient mechanical stability for cutting new thin layers or slices 505 with a thickness substantially equal or inferior to the critical thickness of the single crystal material of the ingot remainder 501'.

Following a variant of the inventive method, and as illustrated in portion 5d of FIG. 5, the free surface 507 of the slice 505 comprised in the self-standing structure 510, is attached to a surface 503 of the handle substrate 502 by an adhesive layer 508, which compensates for the surface roughness of the free surface 507 of the thin layer 505, which was not submitted to any polishing step prior to the attachment and, thus, still exhibits the surface roughness due to the cutting step. Like in the previous embodiments, the adhesive 508 can be a ceramic-based or a graphite-based adhesive. The thereby formed intermediate pseudo-substrate 511 is then annealed at a temperature in the range of 80° C. to 400° C. in order to strengthen the adhesive layer 508.

According to variants of the inventive method, the pseudo-substrate 511 can then be treated similarly to a wafer and undergo several preparation and finishing steps, such as chamfering, cutting a flat or a notch, and/or also removing the stiffener 509, which, in this case, is then only used as a temporary substrate for obtaining a slice 505 thinner than the critical thickness of the single crystal material. As illustrated in portion 5e of FIG. 5, a final pseudo-substrate 512 can thus be obtained, with an even thinner single crystal layer 505' and a thinned and/or polished single crystal free surface 506'.

Figure 6:
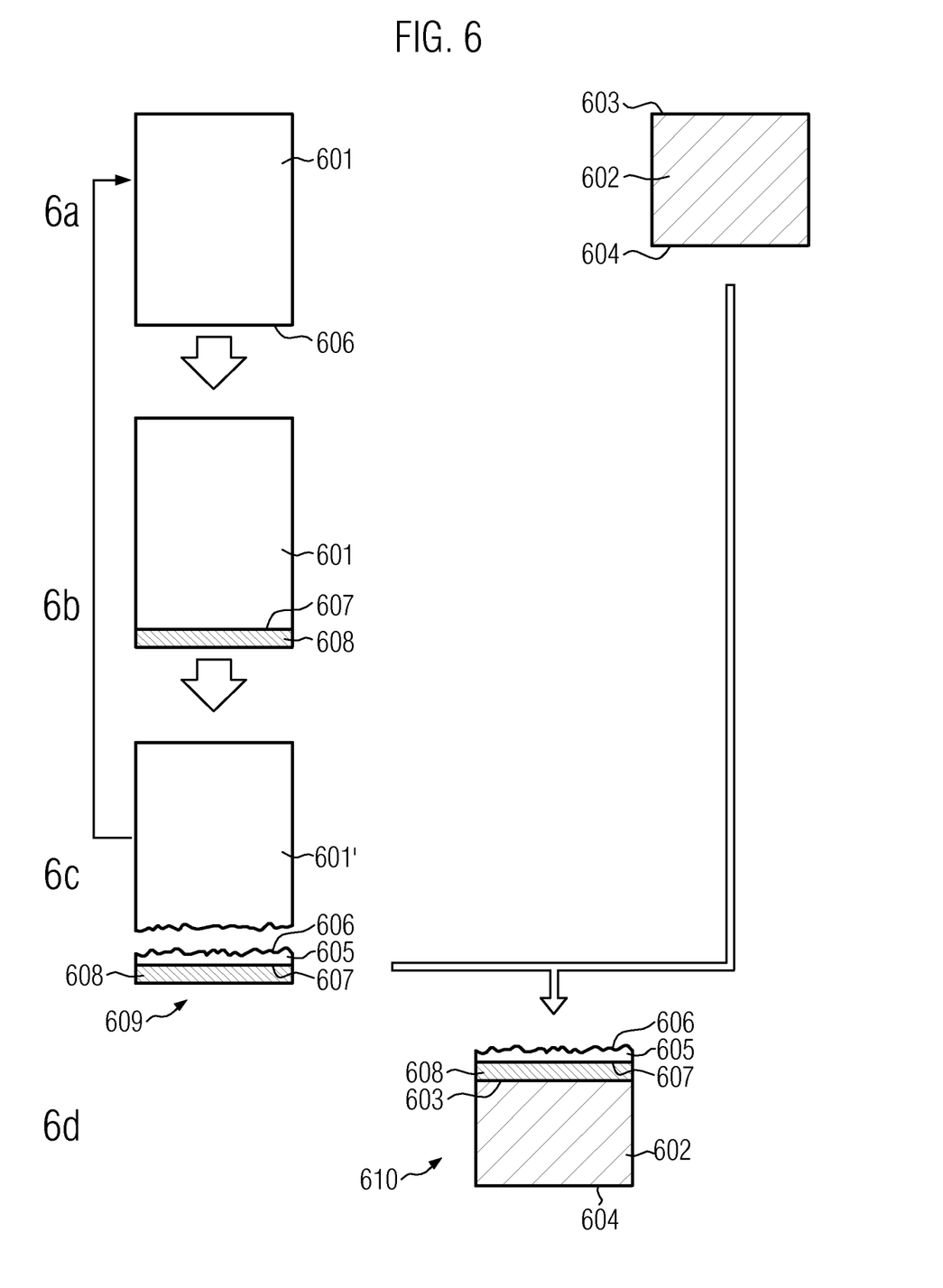
FIG. 6, including portions 6a through 6d, illustrates a sixth embodiment of the invention.

FIG. 6, portions 6a through 6d, illustrates a sixth exemplary embodiment.

Portion 6a of FIG. 6 illustrates a single crystal ingot 601 of SiC and a handle substrate 602 of Si. The same alternative materials as in the previous embodiments can be used in variants of this embodiment. Like in the previous embodiments, the handle substrate 602 also comprises two free surfaces 603, 604.

According to a variant of the inventive method, in the sixth embodiment, as illustrated in portion 6b of FIG. 6, a layer 608 of a stiffener is deposited, in particular, by chemical vapor deposition (CVD) or by plasma-enhanced chemical vapor deposition (PECVD), on a free surface 607 of the ingot 601. In this embodiment, the deposited layer 608 is a layer of an oxide chosen so that it has the same properties as a native oxide of the material of the ingot 601. Thus, a variety of oxides could be used in alternative embodiments and will depend mainly on the material of the ingot 601. The oxide layer 608 compensates the surface roughness of the surface 607 of the ingot 501 on which it is deposited.

In a variant of this embodiment, the stiffener could be a refractory metal such as W, Mo, or the like, chemically and physically stable at least under 900° C. In the variant of a layer 608 of a refractory metal, the layer 608 can have a thickness about 100 µm and can be deposited, e.g., by chemical vapor deposition (CVD).

According to a variant of the invention, the deposited layer 608 is a stiffener that now provides enough mechanical stability to cut a thin slice 605 of the single crystal ingot 601, whose thickness can be even below the critical thickness, as illustrated in portion 6c of FIG. 6. In this example, the thickness of the slice 605 is about 100 µm, which is less than the critical thickness of the material of the ingot 601, for instance, SiC. The thin slice 605 and the oxide layer 608 now form a mechanically stable self-standing structure 609 with a free surface 606 of single crystal material, which can display a level or surface roughness due to the cutting, e.g., sawing, process. Like in the first embodiments, and as further illustrated in portion 6c of FIG. 6, the remainder 601' of the initial single crystal ingot 601 can then be reused, in particular, without undergoing any polishing step, for cutting other single crystal slices 605. Similarly to the fifth embodiment, this is possible since the deposited oxide layer 608 will compensate the surface roughness of the ingot 601' and allow sufficient mechanical stability for cutting new thin layers or slices 605 with a thickness substantially equal or inferior to the critical thickness of the single crystal material of the ingot 601'.

Following a variant of the inventive method, the thin slice 605 forming the self-standing structure 609 with the oxide layer 608 could now be attached to the handle substrate 602 by its free single crystal surface 606 using an adhesive such as a ceramic or a graphite-based adhesive, resulting in a pseudo-substrate similar to the intermediate pseudo-substrate 511 of the fifth embodiment illustrated in portion 5d of FIG. 5.

However, in the sixth embodiment, and as illustrated in portion 6d of FIG. 6, advantage is taken of the oxide layer 608 forming the stiffening and mechanically stabilizing part of the self-standing structure 609. In the sixth embodiment, the self-standing structure 609 is attached to a free surface 603 of the handle substrate 602 by molecular bonding using the oxide layer 608 as a bonding layer. This is possible, in particular, because the oxide layer 608 compensates the surface roughness of the single crystal surface 607 on which it was deposited. Thus, a pseudo-substrate 610 is obtained, wherein a thin slice 605 of a single crystal with a thickness inferior to its critical thickness is attached to a handle substrate 602, in particular, by molecular bonding using the oxide layer 608 as the bonding layer. The pseudo-substrate 610 comprises a free surface 606 of the single crystal material thin slice 605. At this point, the free surface 606 did not require any particular polishing step.

According to variants of the inventive method, the pseudo-substrate 610 can now be treated similarly to a wafer and undergo several preparation and finishing steps such as chamfering, cutting a flat or a notch, and/or also thinning and/or polishing the free surface 606 of the single crystal material or the back side 604 of the handle substrate 602.

According to variants of the invention, and similarly to the four embodiments illustrated in FIGS. 1 through 4, in the fifth and sixth embodiments, other subsequent technological steps can be performed, such as ion implantations, annealing steps, or depositing contact layers. Furthermore, the handle substrates 502, 602 can also be removed partially or totally using grinding or polishing techniques of the respective back side or remaining free surfaces 504, 604 of the substrate 502, 602 on the intermediate or final assemblies 511, 512, 610. Like in variants of the previous embodiments, such a step advantageously allows removing the adhesive layer 508 or the deposited oxide layer 608 from the back side 507, 607 of the single crystal slice 505, 505' or 605, which can subsequently be treated, for example, in order to build an electrical contact and finally split in order to form final electrical components.

Figure 7:
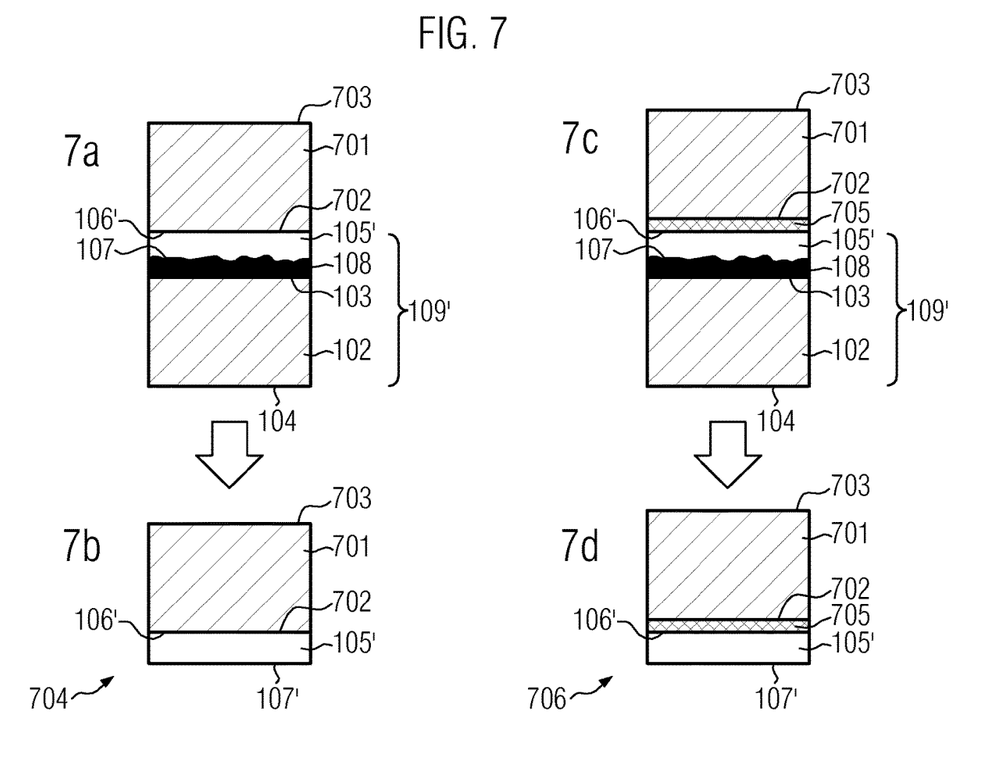
FIG. 7, including portions 7a through 7d, illustrates a seventh embodiment of the invention describing a direct bonding of a thin cut slice onto a final substrate.

FIG. 7, portions 7a through 7d, illustrates the use of the inventive thinned pseudo-substrate 109' of the second embodiment illustrated in portion 2a of FIG. 2, according to a seventh exemplary embodiment.

In the seventh embodiment, like in the second embodiment, the thinned layer 105' is a layer of GaN. In particular, the back side surface 107 corresponds to the Ga face of the GaN thinned layer 105', and the polished thinned surface 106' corresponds to the N face of the GaN thinned layer 105'. In the seventh embodiment, the substrate 102 can be sapphire instead of an Si wafer like in the first and second embodiments, with a matching coefficient of thermal expansion (CTE) relatively to the GaN material of the thinned layer 105'. Furthermore, in the seventh embodiment, the free thinned surface 106' is polished such that it surface roughness is compatible with a direct bonding.

As illustrated in portion 7a of FIG. 7, a final substrate 701 is attached by one of its free surfaces 702, 703, here surface 702, to the polished free surface 106' of the thinned layer 105' by direct bonding. The final substrate 701 is chosen among any of the materials cited for the previous embodiments, provided that its coefficient of thermal expansion (CTE) matches the CTEs of the thinned layer 105', in this example GaN, and of the handle substrate 102, in this example sapphire.

Next, as illustrated in portion 7b of FIG. 7, the handle substrate 102 and the adhesive layer 108 are then removed entirely, e.g., by mechanical polishing like in the third embodiment and the illustration of portion 3c of FIG. 3, such that a final structure 704 is obtained wherein the original back side surface 107 of the GaN slice 105 has become a free surface 107'. This free surface 107' can, in turn, also be polished, thinned and/or patterned for fabricating an even more complex final device.

In an alternative, illustrated by portions 7c and 7d of FIG. 7, a layer 705 of an oxide can be used to improve the direct bonding between the free surface 702 of the final substrate 701 and the polished surface 106' of the thinned pseudo-substrate 109'. It also possible that more than one oxide layer is used instead of oxide layer 705. When the handle substrate 102 and the adhesive layer 108 are removed, a final structure 706 is obtained, similar to the final structure 704 illustrated in portion 7b of FIG. 7, but comprising at least one oxide layer 705.

In yet another alternative to the seventh embodiment, the thinned layer 105' could be a slice of SiC instead of GaN. In this case, the free surface 107' corresponds to the Si face of the SiC thinned layer 105', and the polished surface 106' corresponds to the C face of the SiC thinned layer 105'. Other materials can be chosen like in the previous embodiments, provided that the CTEs match one another, as explained above.

In the embodiments described previously, and their variants, the final assemblies 109, 109', 111, 112, 203, 205, 409, 411, 511, 512, 610, 704 and 706 have all the advantage that the efficiency of usage of an initial ingot of an expensive material has been improved with respect to prior art wafering methods, in particular, with respect to the method disclosed in EP 1 324 385 A2. One reason is that instead of manufacturing a wafer from a single crystal ingot, which requires extensive polishing and thinning steps, according to the inventive method, a slice of the ingot can already be cut at a thickness of approximately the critical thickness below which the slice is no longer mechanically stable if taken alone, or at a thickness even below the critical thickness, such that it is possible to work directly on a thinner single crystal slice compared to prior art methods without needing to polish the slice beforehand. Thus, starting from a single crystal ingot, up to about 30% to about 50% more semiconductor assemblies can be provided compared to the prior art.

The invention claimed is:

1. A method for fabricating a pseudo-substrate comprising the steps of:
providing a single crystal ingot;
cutting a first slice from the single crystal ingot so as to form a rough cut surface on the single crystal ingot;
depositing an oxide layer on the rough cut surface of the single crystal ingot without polishing the rough cut surface of the single crystal ingot; and
after depositing the oxide layer on the rough cut surface of the single crystal ingot, cutting a second slice from the single crystal ingot, the second slice having a same cross-sectional area as the single crystal ingot, wherein the thickness of the second slice is 300 µm or less and is equal to or less than a critical thickness of the second slice, the deposited oxide layer forming a stiffener for the second slice; and
after cutting the second slice, bonding the deposited oxide layer to a handle substrate by direct molecular bonding.

2. The method according to claim 1, further comprising a step of polishing or double-side polishing the pseudo-substrate.

3. The method according to claim 1, further comprising a step of chamfering the edges of the pseudo-substrate.

4. The method according to claim 1, further comprising a step of cutting a flat or a notch in the pseudo-substrate.

5. The method according to claim 1, wherein the single crystal is or comprises at least one of a silicon-based material, a germanium-based material, a II-VI semiconductor material, a III-V semiconductor material, a wide-band gap material, ZnO, sapphire, a piezoelectric material, $LiNbO_3$, and $LiTaO_3$.

6. The method according to claim 1, further comprising a step of fabricating a semiconductor device in or on the pseudo-substrate.

7. The method according to claim 6, further comprising a step of removing the handle substrate after having fabricated the semiconductor device.

8. The method according to claim 1, wherein the ingot has a cylindrical shape and the second slice has a diameter of 2 inches or more.

* * * * *

UNITED STATES PATENT AND TRADEMARK OFFICE
CERTIFICATE OF CORRECTION

PATENT NO.           : 10,910,256 B2
APPLICATION NO.      : 14/422596
DATED                : February 2, 2021
INVENTOR(S)          : Fabrice Letertre and Oleg Kononchuk Page 1 of 1

It is certified that error appears in the above-identified patent and that said Letters Patent is hereby corrected as shown below:

In the Specification
Column 6,     Line 5,       change "ZnO, sapphire," to --ZnO, AlN, sapphire--

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*